United States Patent
Lee et al.

(10) Patent No.: US 6,510,073 B1
(45) Date of Patent: Jan. 21, 2003

(54) TWO TRANSISTOR FERROELECTRIC NON-VOLATILE MEMORY

(75) Inventors: Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/062,850

(22) Filed: Jan. 31, 2002

(51) Int. Cl.[7] .............................................. G11C 11/22
(52) U.S. Cl. ..................... 365/145; 365/149; 257/295
(58) Field of Search ............................... 365/145, 149; 257/295, 296

(56) References Cited

U.S. PATENT DOCUMENTS

| | | | | |
|---|---|---|---|---|
| 5,309,391 A | * | 5/1994 | Papaliolios | 365/145 |
| 5,689,456 A | * | 11/1997 | Kobayashi | 365/145 |
| 5,753,946 A | * | 5/1998 | Naiki et al. | 257/295 |
| 5,774,392 A | * | 6/1998 | Kraus et al. | 365/145 |
| 5,932,904 A | | 8/1999 | Hsu et al. | 257/295 |
| 6,146,904 A | | 11/2000 | Hsu et al. | 438/3 |
| 6,198,652 B1 | * | 3/2001 | Kawakubo et al. | 365/145 |
| 6,449,184 B2 | * | 9/2002 | Kato et al. | 365/145 |
| 6,459,110 B1 | * | 10/2002 | Tani | 365/145 |

OTHER PUBLICATIONS

Article entitled, "A Novel FET–Type Ferroelectric Memory with Excellent Data Retention Characteristics", by Sung–Min Yoon and Hiroshi Ishiwara, published in 2000 IEEE, 0–7803–6441–4/00, consisting of 4 pages.

* cited by examiner

Primary Examiner—Son Mai
(74) Attorney, Agent, or Firm—David C. Ripma; Matthew D. Rabdau; Scott C. Krieger

(57) ABSTRACT

A two transistor ferroelectric non-volatile memory cell includes a ferroelectric capacitor connected to a word line and having an upper electrode and a lower electrode; a first MOS transistor having a linear capacitor located at a gate oxide region thereof, wherein a gate of the first MOS transistor is connected to the lower electrode of said ferroelectric capacitor and wherein a drain of the first transistor is connected to a bit line; a second MOS transistor having a gate connected to a programming line, a drain connected to the lower electrode of the ferroelectric capacitor, and a source connected to a ground and the source of the first transistor; wherein, when a positive pulse is applied to the word line and to the programming line, a charge is placed on the ferroelectric capacitor and the ferroelectric capacitor is decoupled from the MOS linear capacitor by connecting the bottom electrode of the ferroelectric capacitor to the ground state. When a positive pulse is applied to the word line and a positive pulse is applied to the programming line, a "1" state is created. When a negative pulse is applied to the word line and a positive pulse is applied to the programming line, a "0" state is created.

16 Claims, 3 Drawing Sheets

TWO TRANSISTOR FERROELECTRIC NON-VOLATILE MEMORY

FIELD OF THE INVENTION

This invention relates to ferroelectric memory, non-volatile memory and embedded memory, and specifically to a two-transistor memory unit exhibiting long term memory retention and low power consumption.

BACKGROUND OF THE INVENTION

A number of solid state, non-volatile memory devices are known in the art. Flash memory is generally a single transistor memory cell, which may be fabricated in a high packing density array, but which requires high voltage and which has a relatively slow programming process. Electrically Erasable Programmable Read-Only Memory (EEPROM) is a programmable memory array which has similar structural and behavioral characteristics to a flash memory, but which may be selectively erased. A one-transistor one-capacitor ferroelectric random access memory (1T-1C FeRAM) device is similar to a dynamic RAM (DRAM), which has a destructive read-out. The family of 1T FeRAMs is still under development. These devices exhibit high standby leakage current and a low memory retention time, which are the two major obstacles of this family of memories.

Sung-Min Yoon et al., A novel FET-type Ferroelectric Memory with Excellent Data Retention Characteristics, describes a 1T-2C device wherein the data retention durations are enhanced by providing two ferroelectric capacitors, which are polarized in opposite directions, IEDM 2000.

SUMMARY OF THE INVENTION

A two transistor ferroelectric non-volatile memory includes a ferroelectric capacitor having an upper electrode and a lower electrode, wherein the upper electrode is connected to a word line; a first MOS transistor includes a linear capacitor located at a gate oxide region thereof, wherein a gate of the first MOS transistor is connected to the lower electrode of the ferroelectric capacitor and wherein a drain of the first MOS transistor is connected to a bit line and wherein the source of the first MOS transistor is connected to a ground; a second transistor having a gate connected to a programming line, a drain connected to the lower electrode of the ferroelectric capacitor, and a source connected to a ground and the source of the first transistor; wherein, when a positive pulse is applied to the word line and to the programming line, the second transistor is switched on and connects the bottom electrode of the ferroelectric capacitor to the ground, a charge is placed on the ferroelectric capacitor thereby creating a "1" state in the memory. When a negative pulse is applied to the word line and a positive pulse is applied to the programming line, the second transistor is switched on and connects the bottom electrode of the ferroelectric capacitor to the ground, a charge is placed on the ferroelectric capacitor, thereby creating a "0" state in the memory.

It is an object of the invention to provide a FeRAM having non-volatile memory characteristics.

Another object of the invention is to provide a FeRAM having both long memory retention characteristics and low power requirements.

A further object of the invention is to provide a 2T-1C FeRAM.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

The present invention includes a 2T FeRAM, which solves both the high standby leakage current and the low memory retention time problems of 1T FeRAMs, and which exhibits a non-destructive read out.

Figure 1:
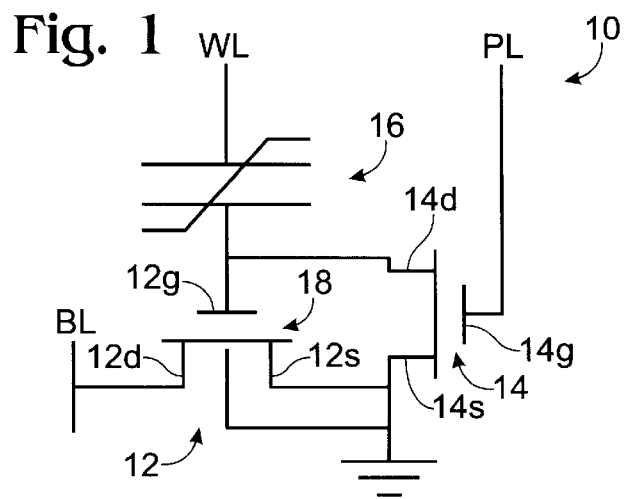
FIG. 1 depicts the 2T FeRAM of the invention.

As previously noted, the 1T ferroelectric memory exhibits several properties which need to be resolved in order to make 1T Fe devices suitable for user applications. The 2T ferroelectric memory cell of the invention solves the problems associated with 1T ferroelectric memory devices. FIG. 1 depicts a 2T FeRAM constructed according to the invention, generally at 10. FeRAM 10 includes a first transistor 12, a second transistor 14, and a ferroelectric capacitor 16, which has a bottom electrode connected to a gate 12g of first transistor 12 and to a drain 14d of second transistor 14. A linear capacitor 18 is located at the gate oxide of first transistor 12.

In the 2T FeRAM cell of the invention, ferroelectric capacitor 16 is connected to gate 12g of first, or cell, transistor 12. Second transistor 14 is the programming transistor. The drain 14d of second transistor 14 is connected to the bottom electrode of ferroelectric capacitor 16 and the gate electrode 12g of cell transistor 12. A word line (WL) is connected to the top electrode of ferroelectric capacitor 16. A programming line (PL) is connected to the gate 14g of second transistor 14, and a bit line (BL) is connected to the drain 12d of first transistor 12, also referred to herein as a memory transistor.

Figure 2A:
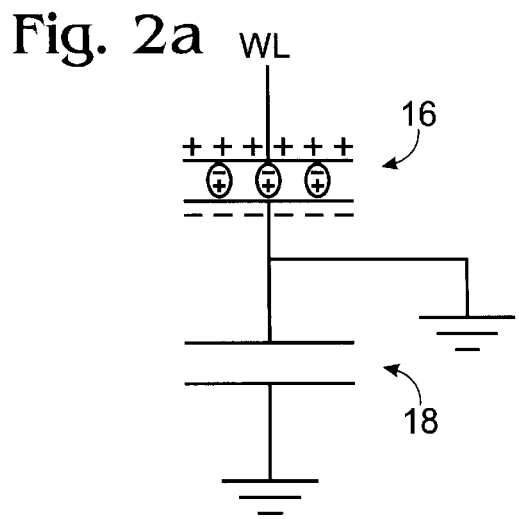
FIGS. 2A and 2B depict the 2T FeRAM of the invention in "0" and "1" states.
Figure 2B:
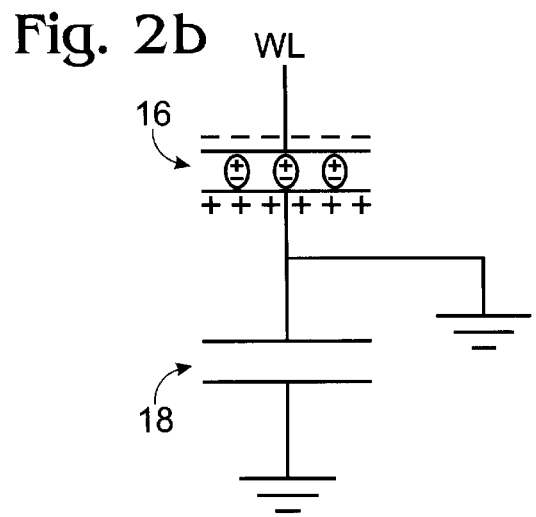

FIG. 2a depicts the 2T FeRAM of the invention in a "0" state, while FIG. 2b depicts the 2T FeRAM in a "1" state during the programming.

Data Retention

Figure 3:
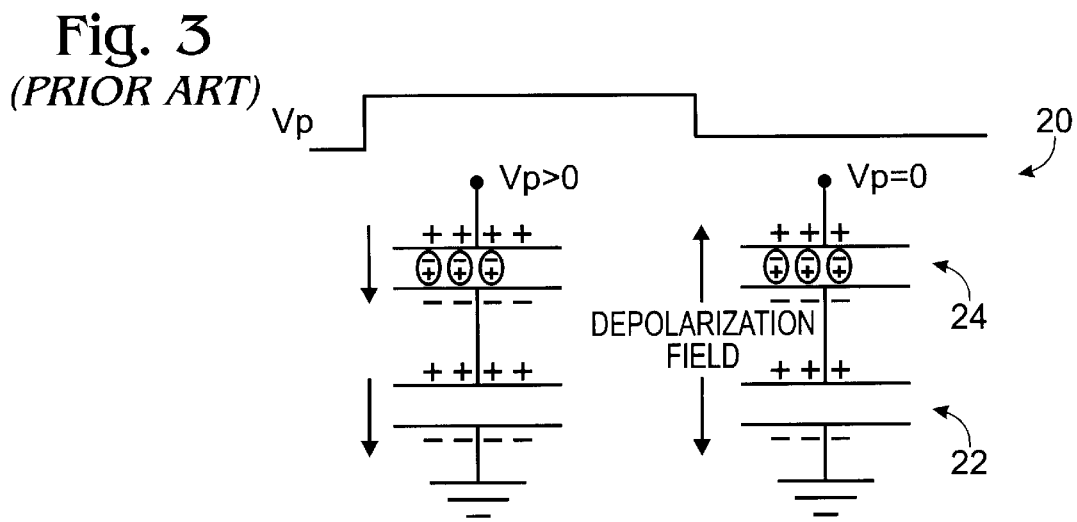
FIG. 3 depicts a prior art 1T FeRAM at the beginning of a programming cycle.

Turning to FIG. 3, a prior art 1T ferroelectric memory is depicted schematically generally at 20. A MOS linear capacitor 22 is formed in series with a ferroelectric capacitor 24. During the beginning of programming cycle (left portion of figure), a voltage is dropped across capacitors 22, 24. The amount of charge on ferroelectric capacitor 24 and liner capacitor 22 are the same. The electric fields across the ferroelectric and linear capacitors are in the same direction. At the end of programming cycle, the programming voltage drops to zero (right side of figure). The voltage created by the free charges on the linear capacitor acts as a battery for the ferroelectric capacitor. The voltage, however, is opposite to that of the polarization direction, and it is therefore called a "depolarization voltage." The depolarization voltage quickly reverses the polarization, and the ferroelectric "memory" disappears.

Figure 4:
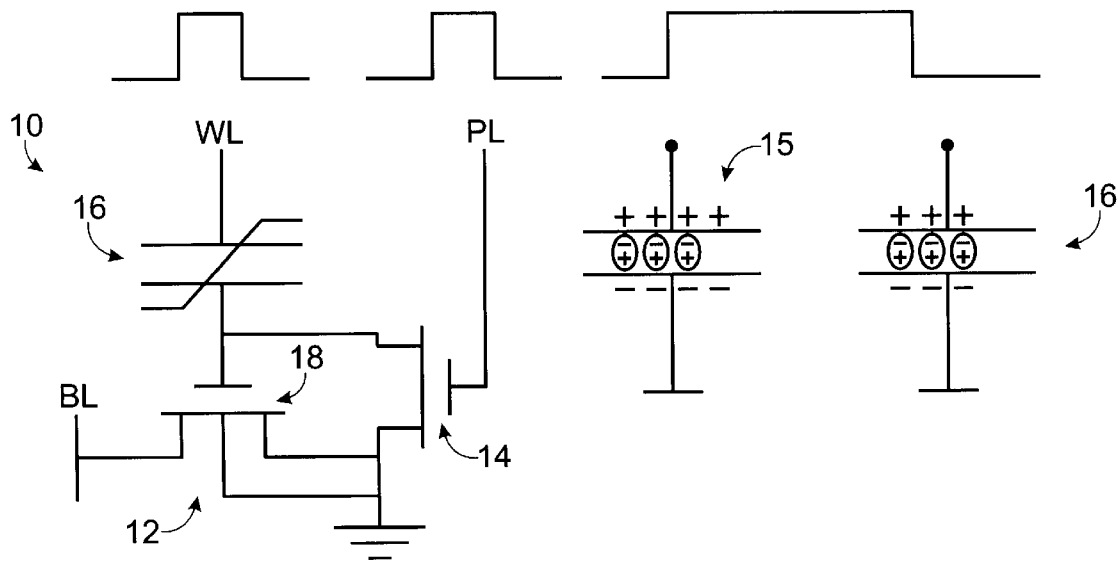
FIG. 4 depicts the 2T FeRAM of the invention at the beginning of a programming cycle.

Referring now to FIG. 4, 2T FeRAM 10 is depicted at the beginning of its programming cycle. To program ferroelectric memory cell 10 to a "0" state, a positive pulse is applied to WL and to PL. Second transistor 14 is switched on and connects the bottom electrode of ferroelectric capacitor 16 to ground, thereby decoupling ferroelectric capacitor 16 from linear capacitor 18. The WL voltage is dropped only across the ferroelectric capacitor. This reduces the programming voltage, as comparing to the 1T ferroelectric memory of FIG. 3. At the end of the programming cycle, the free electrons 15 in ferroelectric capacitor 16 are discharged. There is no depolarization voltage on ferroelectric capacitor 16, resulting in a long retention time for the 2T ferroelectric memory. A similar scheme is followed to write the memory to a "1" state.

Figure 5:
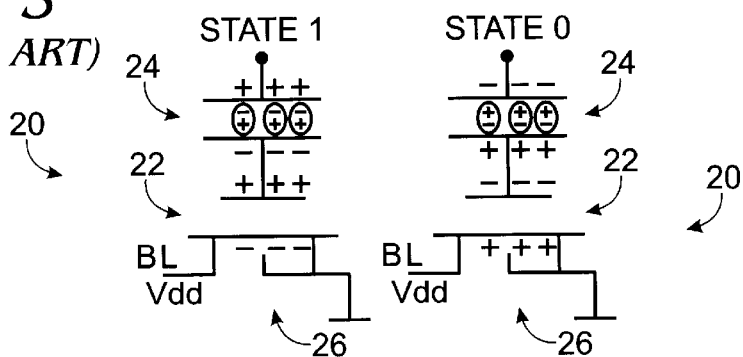
FIG. 5 depicts a prior art 1T FeRAM at the "1" and "0" states.

The reason for the long retention time of the memory device of the invention is that the linear capacitor is decoupled from the ferroelectric capacitor and because both electrodes of ferroelectric capacitor 16 are at the same potential, i.e., the ground potential, after programming, and there is no de-polarization field across the ferroelectric material. In the case of a 1T FeRAM memory cell of the prior art, the voltage across the ferroelectric capacitor, after programming, is the de-polarization voltage: $Q/(C_{ox}+C_{fe})$, where Q is the polarization charge, $C_{ox}$ is the gate oxide capacitance, the so-called linear, or constant, capacitor, and $C_{fe}$ is the capacitance of the ferroelectric capacitor. In the 2T FeRAiM of the invention, a charge that is equal to the storage charge, but of opposite polarity, is induced into the bottom electrode of the ferroelectric capacitor. As a result, the net storage charge is about zero. There is no depolarization field across the ferroelectric capacitor, Standby Current Turning now to FIG. 5, 1T ferroelectric memory 20 is depicted after the device is written to the "1" state on the left side of the figure. Transistor 26 is turned on, and will stay on even after WL is turned off. When $V_{dd}$ is applied to BL to address another memory cell, a current will flow on memory cell 20, even though it is not being addressed. This results in reading noise and requires a higher standby power for memory 20. A selecting transistor to be incorporated into every ferroelectric memory cell has been proposed to address this problem in U.S. Pat. No. 5,932,904, Two transistor ferroelectric memory cell, to Hsu et al., granted Aug. 3, 1999, and in U.S. Pat. No. 6,146,904, for Method of making a two transistor ferroelectric memory cell, also to Hsu et al., granted Nov. 14, 2000, however, the selecting transistor increases the memory cell size to a 2T configuration, as in this invention, without resolving the retention problem of the ferroelectric memory.

Figure 6:
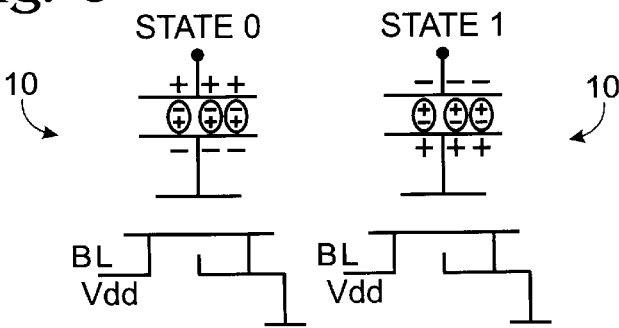
FIG. 6 depicts the 2T FeRAM of the invention at the "1" and "0" states.

Referring to FIG. 6, in the case of 2T ferroelectric memory cell 10, the memory transistor is off on both "1" and "0" states, even when $V_{dd}$ voltage is applied to the BL. Therefore, the 2T FeRAM of the invention has a low standby current.

Non-Destructive Read Out

Figure 7:
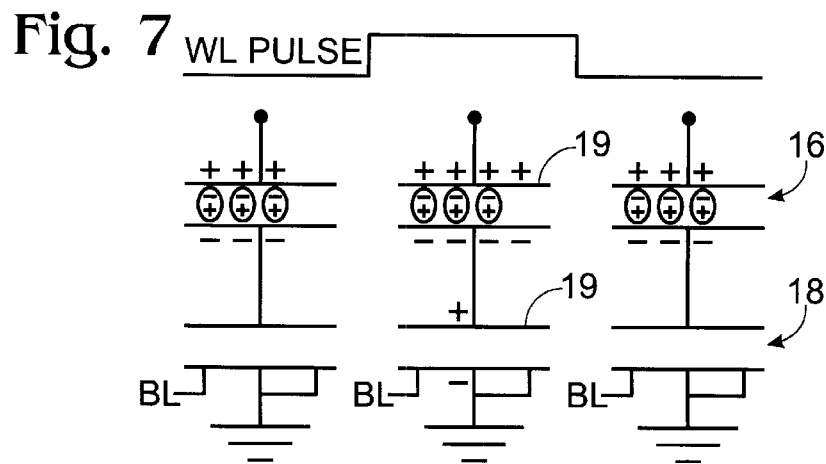
FIGS. 7 and 8 depict the 2T FeRAM of the invention during a read out operation.

Turning to FIG. 7, during a read cycle, positive pulses are applying to WL and BL, leaving PL "floating." In the case of the "0" state of the 2T ferroelectric memory cell of the invention, a positive pulse on WL (center figure) charges the ferroelectric capacitor and the linear capacitor. No domain switching occurs on the ferroelectric capacitor, however, the linear capacitor is charged to $Q_{linear}$ 19. A low current may flow from the source (ground) to the drain (BL) of the memory transistor. After the reading cycle, the linear capacitor charge $Q_{linear}$ is discharged, and the ferroelectric capacitor reverts to its original state.

Figure 8:
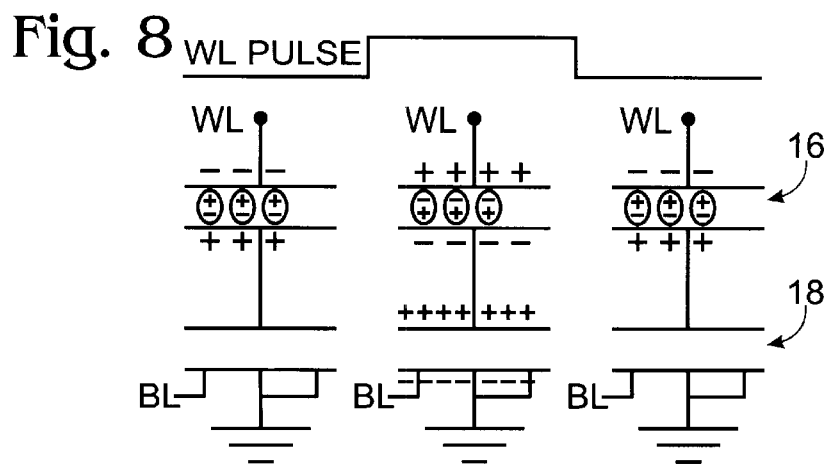

FIG. 8 depicts the reading process of the 2T FeRAM of the invention in a "1" state, wherein a positive pulse on WL (center figure) switches the ferroelectric domain and charges the linear capacitor. A high current may flow from the source (ground) to the drain (BL) of the memory transistor because a strong inversion occurs on an NMOS memory transistor. At the end of read cycle, the linear capacitor generates a strong "depolarization field" which depolarizes the ferroelectric capacitor. This characteristic is similar to that of the 1T ferroelectric memory. In the case of the 2T FeRAM of the invention, however, the depolarization restores the memory back to its original state (right figure) and provides for a non-destructive read-out.

Memory Array

Figure 9:
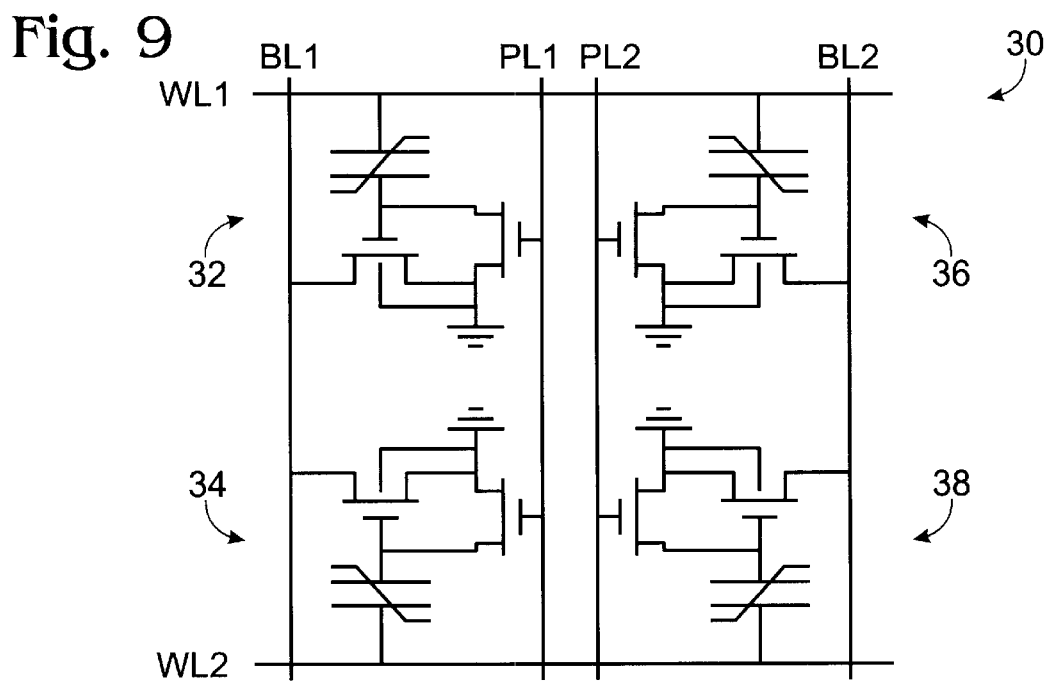
FIG. 9 depicts a memory array of 2T FeRAMs constructed according to the invention.

A memory array of the invention is depicted generally at 30 in FIG. 9, and includes, in this depiction, four 2T FeRAM memory cells constructed according to the invention at 32, 34, 36 and 38.

Thus, a two transistor ferroelectric non-volatile memory has been disclosed. It will be appreciated that further variations and modifications thereof may be made within the scope of the invention as defined in the appended claims.

We claim:

1. A two transistor ferroelectric non-volatile memory comprising:

a ferroelectric capacitor connected to a word line and having an upper electrode and a lower electrode;

a first MOS transistor having gate connected to the lower electrode of said ferroelectric capacitor, wherein a drain of said first transistor is connected to a bit line, and wherein a source of said first MOS transistor is connected to a ground;

a MOS linear capacitor located at the gate oxide of said first MOS transistor; and a second MOS transistor having a gate connected to a programming line, a drain connected to the lower electrode of said ferroelectric capacitor, and a source connected to a ground and said source of said first transistor.

2. The two transistor ferroelectric non-volatile memory of claim 1 wherein, when a positive pulse is applied to said word line and to said programming line, a charge is placed on said ferroelectric capacitor and said linear capacitor, and wherein, after the positive pulse is applied, said ferroelectric capacitor is decoupled from said linear MOS capacitor, thereby creating a "1" state in the memory.

3. The two transistor ferroelectric non-volatile memory of claim 1 wherein when a negative pulse is applied to the word line and a positive pulse is applied to the programming line, a "0" state is created.

4. The two transistor ferroelectric non-volatile memory of claim 1 wherein said first transistor is off on both "1" and "0" states, even when a voltage is applied to a bit line, thereby requiring a low standby current.

5. The two transistor ferroelectric non-volatile memory of claim 1 wherein, during a reading process of the memory in a "1" state, a positive pulse on the word line switches the ferroelectric domain and charges the linear capacitor.

6. The memory of claim 1 wherein, during a read-out cycle, the memory is read, and retains said charge on said ferroelectric capacitor.

7. A two transistor ferroelectric non-volatile memory comprising:
- a ferroelectric capacitor connected to a word line and having an upper electrode and a lower electrode;
- a first MOS transistor having gate connected to the lower electrode of said ferroelectric capacitor, wherein a drain of said first transistor is connected to a bit line, and wherein a source of said first MOS transistor is connected to a ground;
- a MOS linear capacitor located at the gate oxide of said first MOS transistor;
- a second MOS transistor having a gate connected to a programming line, a drain connected to the lower electrode of said ferroelectric capacitor, and a source connected to a ground and said source of said first transistor;
- wherein, when a positive pulse is applied to said word line and to said programming line, a charge is placed on said ferroelectric capacitor and said ferroelectric capacitor is decoupled from said linear MOS capacitor, thereby creating a "1" state in the memory.

8. The two transistor ferroelectric non-volatile memory of claim 7 wherein when a negative pulse is applied to the word line and a positive pulse is applied to the programming line, a "0" state is created.

9. The two transistor ferroelectric non-volatile memory of claim 7 wherein said first transistor is off on both "1" and "0" states, even when a voltage is applied to a bit line, thereby requiring a low standby current.

10. The two transistor ferroelectric non-volatile memory of claim 7 wherein, during a reading process of the memory in a "1" state, a positive pulse on the word line switches the ferroelectric domain and charges the linear capacitor.

11. The two transistor ferroelectric non-volatile memory of claim 7 wherein, during a read-out cycle, the memory is read, and retains said charge on said ferroelectric capacitor.

12. A two transistor ferroelectric non-volatile memory comprising:
- a ferroelectric capacitor connected to a word line and having an upper electrode and a lower electrode;
- a first MOS transistor having gate connected to the lower electrode of said ferroelectric capacitor, wherein a drain of said first transistor is connected to a bit line, and wherein a source of said first MOS transistor is connected to a ground;
- a MOS linear capacitor located at the gate oxide of said first MOS transistor; and
- a second MOS transistor having a gate connected to a programming line, a drain connected to the lower electrode of said ferroelectric capacitor, and a source connected to a ground and said source of said first transistor;
- wherein when a negative pulse is applied to the word line and a positive pulse is applied to the programming line, a "0" state is created.

13. The two transistor ferroelectric non-volatile memory of claim 12 wherein, when a positive pulse is applied to said word line and to said programming line, a charge is placed on said ferroelectric capacitor and said linear capacitor, and wherein, after the positive pulse is applied, said ferroelectric capacitor is decoupled from said linear MOS capacitor, thereby creating a "1" state in the memory.

14. The two transistor ferroelectric non-volatile memory of claim 12 wherein said first transistor is off on both "1" and "0" states, even when a voltage is applied to a bit line, thereby requiring a low standby current.

15. The two transistor ferroelectric non-volatile memory of claim 12 wherein, during a reading process of the memory in a "1" state, a positive pulse on the word line switches the ferroelectric domain and charges the linear capacitor.

16. The two transistor ferroelectric non-volatile memory of claim 12 wherein, during a read-out cycle, the memory is read, and retains said charge on said ferroelectric capacitor.

* * * * *